United States Patent
Hoeoek et al.

(10) Patent No.: US 11,143,740 B2
(45) Date of Patent: Oct. 12, 2021

(54) VEHICLE RADAR SYSTEM COMPRISING AN AUXILIARY POWER SOURCE

(71) Applicant: SAAB AB, Linkoeping (SE)

(72) Inventors: Anders Hoeoek, Hindas (SE); Max Wallen, Moelnlycke (SE); Bruno Lumetzberger, Saevedalen (SE); Valter Nilsson, Hovas (SE)

(73) Assignee: SAAB AB, Linkoeping (SE)

( * ) Notice: Subject to any disclaimer, the term of this patent is extended or adjusted under 35 U.S.C. 154(b) by 0 days.

(21) Appl. No.: 17/276,612

(22) PCT Filed: Sep. 26, 2018

(86) PCT No.: PCT/SE2018/050983
§ 371 (c)(1),
(2) Date: Mar. 16, 2021

(87) PCT Pub. No.: WO2020/067939
PCT Pub. Date: Apr. 2, 2020

(65) Prior Publication Data
US 2021/0247487 A1 Aug. 12, 2021

(51) Int. Cl.
*G01S 7/03* (2006.01)
*H03F 3/24* (2006.01)
(Continued)

(52) U.S. Cl.
CPC .............. *G01S 7/03* (2013.01); *G01S 13/931* (2013.01); *H01Q 3/26* (2013.01); *H03F 3/245* (2013.01);
(Continued)

(58) Field of Classification Search
CPC ............. H02J 1/084; H02J 1/106; H02J 1/109
(Continued)

(56) References Cited

U.S. PATENT DOCUMENTS 4,841,161 A * 6/1989 Lentini ................... H02J 1/102
307/85
4,866,295 A * 9/1989 Leventis ................. G05F 1/59
307/43
(Continued)

FOREIGN PATENT DOCUMENTS

EP   2738912 A1 * 6/2014  ............... H02J 7/34
GB   1597943 A   * 9/1981  ............. G01S 7/282
(Continued)

OTHER PUBLICATIONS

International Searching Authority, International Search Report and Written Opinion received for International Application No. PCT/SE2018/050983, dated Jun. 18, 2019, 12 pages, Swedish Patent and Registration Office, Sweden.

*Primary Examiner* — Bernarr E Gregory
(74) *Attorney, Agent, or Firm* — Alston & Bird LLP

(57) ABSTRACT

The present invention relates to a radar system for a vehicle, a method for controlling a radar system, a computer program product, and a vehicle comprising such a radar system. The radar system comprises an antenna arrangement for transmitting and/or receiving electromagnetic waves, a power supply connected to the antenna arrangement, the power supply being arranged to supply the antenna arrangement with operating power. The radar system further comprises an antenna controller connected to the antenna arrangement, the antenna controller being configured to control an operation of the antenna arrangement. The radar system also comprises an auxiliary power source connectable to the antenna arrangement for supplying the antenna arrangement with supplementary operating power so to increase an output power of the antenna arrangement, and a boost controller connected to the auxiliary power source and to the antenna controller, the boost controller being configured to connect and disconnect the auxiliary power source to/from the
(Continued)

antenna arrangement. Hereby presenting a radar system capable of increasing the maximum range of the antenna arrangement during an arbitrary period of time without suffering from too heavy penalties in terms of increased weight or cost.

16 Claims, 2 Drawing Sheets

(51) Int. Cl.
*H03G 3/30* (2006.01)
*G01S 13/931* (2020.01)
*H01Q 3/26* (2006.01)
*G01S 13/00* (2006.01)

(52) U.S. Cl.
CPC ..... *H03G 3/3042* (2013.01); *H03F 2200/451* (2013.01); *H03G 2201/103* (2013.01); *H03G 2201/307* (2013.01)

(58) Field of Classification Search
USPC .............................................. 307/43, 44, 49
See application file for complete search history.

(56) References Cited

U.S. PATENT DOCUMENTS

| | | | |
|---|---|---|---|
| 6,608,403 B2* | 8/2003 | Liu .......................... | H02J 1/102 307/77 |
| 7,345,620 B2* | 3/2008 | Voigtlaender ......... | G01S 13/931 342/82 |
| 7,952,231 B1* | 5/2011 | Zansky ..................... | H02J 7/34 307/59 |
| 7,960,861 B2* | 6/2011 | Gscheidle ............... | H02J 1/108 307/52 |
| 2004/0061380 A1* | 4/2004 | Hann ...................... | H02J 1/102 307/43 |
| 2008/0291087 A1 | 11/2008 | Tietjen et al. | |
| 2009/0294576 A1 | 12/2009 | LaForge | |
| 2012/0205976 A1* | 8/2012 | Shih et al. .............. | H02J 1/108 307/24 |
| 2017/0276770 A1 | 9/2017 | Lin et al. | |
| 2019/0372363 A1* | 12/2019 | Cutcher .................. | H02J 1/084 |

FOREIGN PATENT DOCUMENTS

| | | |
|---|---|---|
| KR | 20160070383 A | 6/2016 |
| WO | WO 02/095964 A1 | 11/2002 |
| WO | WO 2016/204665 A1 | 12/2016 |
| WO | WO 2017/007525 A2 | 1/2017 |

* cited by examiner

VEHICLE RADAR SYSTEM COMPRISING AN AUXILIARY POWER SOURCE

CROSS REFERENCE TO RELATED APPLICATIONS

This application is a National Stage Application, filed under 35 U.S.C. § 371, of International Application No. PCT/SE2018/050983, filed Sep. 26, 2018; the contents of which are hereby incorporated by reference in their entirety.

BACKGROUND

Related Field

The present invention relates to a radar system for a vehicle, a method for controlling such a radar system, a computer program product comprising code for performing the method, and a vehicle comprising such a radar system. The radar system may be applied in vehicles, such as for example in fighter aircraft or antenna equipped terrain vehicles. Although the invention will mainly be described with respect to a fighter aircraft, the invention is not restricted to this particular use but may also be used in other types of vehicles.

Description of Related Art

Radar can be described as an object-detection system that uses electromagnetic waves to determine the range, angle, or velocity of external objects. It may for example be used to detect aircraft, ships, guided missiles, motor vehicles, weather formations, as well as terrain.

The modern uses of radar are accordingly very diverse, including air and terrestrial traffic control, radio astronomy, air-defence systems, antimissile systems, marine radars to locate landmarks and other ships, aircraft anti-collision systems, ocean surveillance systems, outer space surveillance and rendezvous systems, meteorological precipitation monitoring, altimetry and flight control systems, guided missile target locating systems, ground-penetrating radar for geological observations, and range-controlled radar for public health surveillance.

Conventionally a radar system includes a transmitter producing electromagnetic waves in the radio or microwaves domain, a transmitting antenna, a receiving antenna (often the same antenna is used for transmitting and receiving), a receiver and processor to determine properties of the object(s). Electromagnetic waves (pulsed or continuous) from the transmitter reflect off the object and return to the receiver, giving information about the object's location and speed. In aviation, an aircraft is equipped with a radar system that can be used to warn of aircraft or other obstacles in or approaching their path, display weather information, and give accurate altitude readings.

In military applications, fighter aircraft are usually provided with targeting radars, to detect and target enemy vehicles. Moreover, there is an ever increasing need for improved situational awareness in the theatre of operation. This coupled with the decrease in Radar Cross Section (RCS) of near-future threats, such as stealthy Unmanned Aerial Vehicles (UAVs), missiles and fifth generation fighters, puts great stress on the radar as it is the primary sensor of many military aircraft. Another aspect that also requires increased performance of the radar is the fielding of missiles with longer operational range. The radar detection and tracking range shall preferably exceed, or at least not fall short of, the operational range of the missile. As always, the improvement in performance shall preferably be made without increasing the mass, size and cost of the system or platform.

Accordingly, there is a need for improved performance of radar systems, particularly in aviation applications, in order to increase its maximum range. In other words, there is a need for a new and improved radar system for vehicles which has longer detection and tracking range without causing large penalties in mass, size and/or cost.

BRIEF SUMMARY

It is therefore an object of the present invention to provide a radar system for a vehicle, a method for controlling a radar system, a computer program product, and a vehicle which alleviate all or at least some of the above-discussed drawbacks of presently known systems.

This object is achieved by means of a radar system, a method, and a computer program product as defined in the appended claims. The term exemplary is in the present context to be understood as serving as an instance, example or illustration.

According to a first aspect of the present invention, there is provided a radar system for a vehicle comprising:

an antenna arrangement for transmitting and/or receiving electromagnetic waves, the antenna arrangement comprising at least one antenna unit having at least one power amplifier and at least one antenna element;

a power supply connected to the antenna arrangement, the power supply being arranged to supply the antenna arrangement with operating power;

an antenna controller connected to the antenna arrangement, the antenna controller being configured to control an operation of the antenna arrangement;

an auxiliary power source connectable to the antenna arrangement for supplying the antenna arrangement with supplementary operating power so to increase an output power of the antenna arrangement; and a boost controller connected to the auxiliary power source and to the antenna controller, the boost controller being configured to connect and disconnect the auxiliary power source to/from the antenna arrangement.

Hereby presenting a radar system capable of increasing the maximum detection and tracking range of the antenna arrangement for an arbitrary period of time without suffering too much from a trade-off in terms of increased weight or costs. In more detail, the proposed radar system comprises a control unit which is configured to selectively and purposely provide the antenna arrangement with supplementary operating power from the auxiliary power source.

The term connected is in the present context to be understood as "operatively connected", i.e. directly or indirectly connected. The auxiliary power source (can be referred to as an energy storage unit) may for example comprise at least one of a primary battery, a secondary battery, a fuel cell, a capacitor, and a super-capacitor. In other words, the auxiliary power source may for example be based on a mechanical storage (e.g. a flywheel), electrochemical storage (e.g. a battery), electrical storage (e.g. super capacitor), chemical storage (e.g. hydrogen for a fuel cell), and/or thermal storage (e.g. heat).

The antenna arrangement may for example be, an active or passive electronically scanned array (ESA). Accordingly, each antenna element may be associated with an individual transmit/receive module (including the power amplifier), or a plurality of antenna elements may be associated with one common transmit/receive module.

Moreover, in accordance with an exemplary embodiment of the invention the auxiliary power source may be detachable and replaceable. Hereby, the maintenance of the vehicle can be facilitated.

The functionality of connecting/disconnecting the auxiliary power source (i.e. the functionality of the boost controller) may be performed by a sub-unit of the antenna controller or a part of the antenna controller. It may however also be provided by a completely separate control unit which is directly or indirectly connected to the antenna controller. Both the antenna controller and the boost controller may be integrated within a common "system controller". The controller(s) can be provided by means of appropriate software, hardware or a combination thereof.

The present invention is at least partly based on the realization that by providing an auxiliary power source capable of giving a momentary injection of energy/power into an antenna arrangement of a radar system, it is possible to temporarily increase the maximum range of the radar system (in e.g. critical situations) without having to increase the size of the main power supply (e.g. vehicle generator) or make substantial modifications to the antenna arrangement. Thus, by only adding a (smaller) auxiliary power source (such as e.g. a battery), one can inject a power boost to the antenna arrangement when needed, without too large penalties in terms of mass, size, and cost.

The inventors further realized that the need for increased power output is in many cases momentary, and is in practice only for specific situations which make up only a fraction of the full mission time on average. Moreover, the introduction of Gallium nitride (GaN) semiconductors, and the unparalleled performance of GaN-based High Power Amplifiers (HPA) makes it possible to design systems that are no longer limited by the maximum output power of the HPA, but rather the available supply in terms of input power.

Further, in accordance with an exemplary embodiment of the present invention, the antenna controller is configured to change a duty cycle of the at least one power amplifier when the auxiliary power source is connected to the antenna arrangement, so to increase the output power of the antenna arrangement. By changing the duty cycle (for example increasing the duty cycle), when the auxiliary power source is connected to the antenna arrangement, the output power of the antenna arrangement can effectively be increased. The duty cycle may also be referred to as a "transmit duty cycle", i.e. the duty cycle for when the antenna arrangement is used for transmission of signals.

Further, in accordance with another exemplary embodiment of the present invention, the radar system comprises a plurality of antenna units, each antenna unit being an individually controllable antenna unit, and wherein the antenna controller is configured to:

activate a first set of antenna units when the auxiliary power source is not connected to the antenna arrangement, and activate a second set of antenna units when the auxiliary power source is connected to the antenna arrangement;

wherein the second set of antenna units comprises a higher number of individually controllable antenna units than the first set of antenna units. By momentarily having more antennas units active when the auxiliary power source is connected to the antenna arrangement, the output power of the antenna arrangement can momentarily be increased. The first set of antenna units may be a sub-group of the second set of antenna units, i.e. during normal operation there is a first group of antenna units active, but in a "boost mode" (when the auxiliary power source supplies supplementary operating power) additional antenna units are activated. However, alternatively the first set and the second set of antenna units may be completely separate groups of antenna units.

Thus, each antenna element may be connected to an associated transmit and/or receive module having controllable electronics (including the power amplifier), whereby the activation/deactivation of antenna elements can for example be achieved by controlling the associated electronics.

Even further, in accordance with another exemplary embodiment of the present invention, the antenna controller is configured to:

increase a peak power output of the at least one power amplifier by controlling a biasing of the at least one power amplifier, when the auxiliary power source is connected to the antenna arrangement. Accordingly, by controlling the biasing of the power stage (including the power amplifier(s)) of the antenna arrangement, the maximum output power of the antenna arrangement can effectively be increased.

Still further, in accordance with yet another exemplary embodiment, the antenna controller is configured to identify an operating mode of said antenna arrangement, and wherein said boost controller is configured to connect and disconnect said auxiliary power source to/from said antenna arrangement based on said operating mode.

An operating mode may for example be a low power mode (e.g. return flights after a mission), normal operating mode, or high power mode (e.g. detecting/tracking low radar cross-section targets at long distance). Thus, based on the current operating mode, which may be manually selectable by a pilot/driver/operator, the boost controller is configured to control temporary injections of supplementary operating power. This allows for better energy management and conservation of energy to be used only for specific "high need" situations.

In accordance with yet another exemplary embodiment, the power supply is selectively and directly connectable to the antenna arrangement and to the auxiliary power source, and wherein the boost controller is further configured to:

connect and disconnect the power supply from the antenna arrangement; and connect and disconnect the power supply from the auxiliary power source.

In other words, the (main) power supply, can be arranged to either supply power directly to the antenna arrangement, or via the auxiliary power source. In the latter arrangement, the auxiliary power source can be charged at the same time while the antenna arrangement is operating if the input power requirement of the antenna arrangement is lower than the available output power of the power supply. Thus, in accordance with an exemplary embodiment the auxiliary power source is rechargeable and connectable to the power supply, and wherein the boost controller is configured to connect the power supply to the auxiliary power source in order to recharge the auxiliary power source.

Yet further, in accordance with another exemplary embodiment of the present invention, the antenna controller is configured to identify an operating mode of the antenna arrangement, and wherein the boost controller is configured to connect and disconnect the power supply to/from the antenna arrangement and to/from the auxiliary power source based on the operating mode. Hereby, the radar system can be arranged to for example dynamically adjust the charging/discharging of the auxiliary power source based on a current operating mode (i.e. based on a current need for antenna power output). In a more practical example, in military operations, the radar system can be arranged to charge the auxiliary power source by connecting the main power source thereto, when the aircraft is returning from a mission or any other situation when there is a reduced need for high power radar functionality.

In accordance with yet another exemplary embodiment of the present invention, the boost controller is further configured to:

determine a magnitude of power and/or energy available in the auxiliary power source;

determine a magnitude of power and/or energy available in the power supply;

connect the power supply and/or the auxiliary power source to the antenna arrangement based on the determined magnitudes of power and/or energy available in the auxiliary power source and in the power supply.

Thus, available power or energy in the (main) power supply or in the auxiliary power source may also be used as an input parameter before providing the power boost to the antenna arrangement or recharging the auxiliary power source with the (main) power supply.

Further, in accordance with another exemplary embodiment, the antenna arrangement has a low power mode, and wherein the boost controller is further configured to:

determine if the antenna arrangement is in the low power mode;

if the antenna arrangement is in the low power mode, connect the power supply to the auxiliary power source in order to recharge the auxiliary power source.

A low power mode of the antenna arrangement may for example be an antenna off mode (i.e. the antenna arrangement of the radar system is not in operation), a short range radar operation mode, (i.e. the antenna arrangement is used with reduced output power as compared to normal operation), or when only a limited number of operational antenna units are to be used (i.e. when a selected number of antenna units are not in operation). In reference to the latter, this may be referred to as a listening mode, i.e. when the antenna arrangement assigns a receive function and a transmit function to individual antenna units, wherefore a low power mode may include when the antenna arrangement is used for detection and tracking of targets by only having the receive functionality active.

In accordance with another aspect of the present invention, there is provided a method for controlling a radar system of a vehicle, where the radar system comprises an antenna arrangement for transmitting and/or receiving electromagnetic waves, a power supply arranged to supply the antenna arrangement with operating power, an auxiliary power source connectable to the antenna arrangement for supplying the antenna arrangement with supplementary operating power, wherein the antenna arrangement comprises at least one antenna unit having at least one power amplifier and at least one antenna element. The method comprises:

determining an operational mode of the antenna arrangement;

connecting and disconnecting the auxiliary power source to/from the antenna arrangement based on the determined operational mode. With this aspect of the invention, similar advantages and preferred features are present as in the previously discussed aspect of the invention, and vice versa.

According to an exemplary embodiment of the present invention wherein the method further comprises, changing a duty cycle of the at least one power amplifier based on the determined operational mode. Thereby providing an effective and simple means for adapting the output power of the antenna arrangement based on current needs or currently available energy/power in the power sources.

Further, in accordance with another exemplary embodiment of the present invention, the antenna arrangement comprises a plurality of antenna units, each antenna unit being an individually controllable antenna unit, and wherein the method further comprises:

activating a first set of antenna units;

activating a second set of antenna units while the supplementary operating power is being supplied to the antenna arrangement; and wherein the second set of antenna units comprises a higher number of individually controllable antenna units than the first set of antenna units. In other words, antenna units which may be turned off (inactive) during normal operation, can be turned on (activated) in order to increase the maximum power output of the antenna arrangement (e.g. in order to increase radar range).

Even further, in accordance with another exemplary embodiment of the present invention, wherein the method further comprises:

increasing a peak power output of said at least one power amplifier by controlling a biasing of said at least one power amplifier. Thus, by re-biasing the power amplifiers of the antenna arrangement, one can achieve an increased power output.

Moreover, in accordance with another aspect of the present invention, there is provided a computer program product comprising a non-transitory computer readable medium having stored thereon a computer program for controlling a control unit of a radar system for a vehicle, wherein the computer program product comprises code for performing the method according to any one of the embodiments discussed with respect to the second aspect of the present invention.

With this aspect of the invention, similar advantages and preferred features are present as in the previously discussed aspects of the invention, and vice versa.

Further, in accordance with yet another aspect of the present invention, there is provided an aircraft comprising a radar system according to any one of the embodiments discussed in reference to the first aspect of the invention in the foregoing. The aircraft may be any type of aircraft including an unmanned aerial vehicle (UAV).

Yet further, in accordance with yet another aspect of the present invention, there is provided a vehicle, such as e.g. an aircraft, comprising a radar system in accordance with any one of the embodiments discussed with respect to the first aspect of the invention.

These and other features and advantages of the present invention will in the following be further clarified with reference to the embodiments described hereinafter.

BRIEF DESCRIPTION OF THE FIGURES

For exemplifying purposes, the invention will be described in closer detail in the following with reference to embodiments thereof illustrated in the attached drawings, wherein.

DETAILED DESCRIPTION OF VARIOUS EMBODIMENTS

In the following detailed description, preferred embodiments of the present invention will be described. However, it is to be understood that features of the different embodiments are exchangeable between the embodiments and may be combined in different ways, unless anything else is specifically indicated. Even though in the following description, numerous specific details are set forth to provide a more thorough understanding of the present invention, it will be apparent to one skilled in the art that the present invention may be practiced without these specific details. In other instances, well known constructions or functions are not described in detail, so as not to obscure the present invention.

Figure 1:
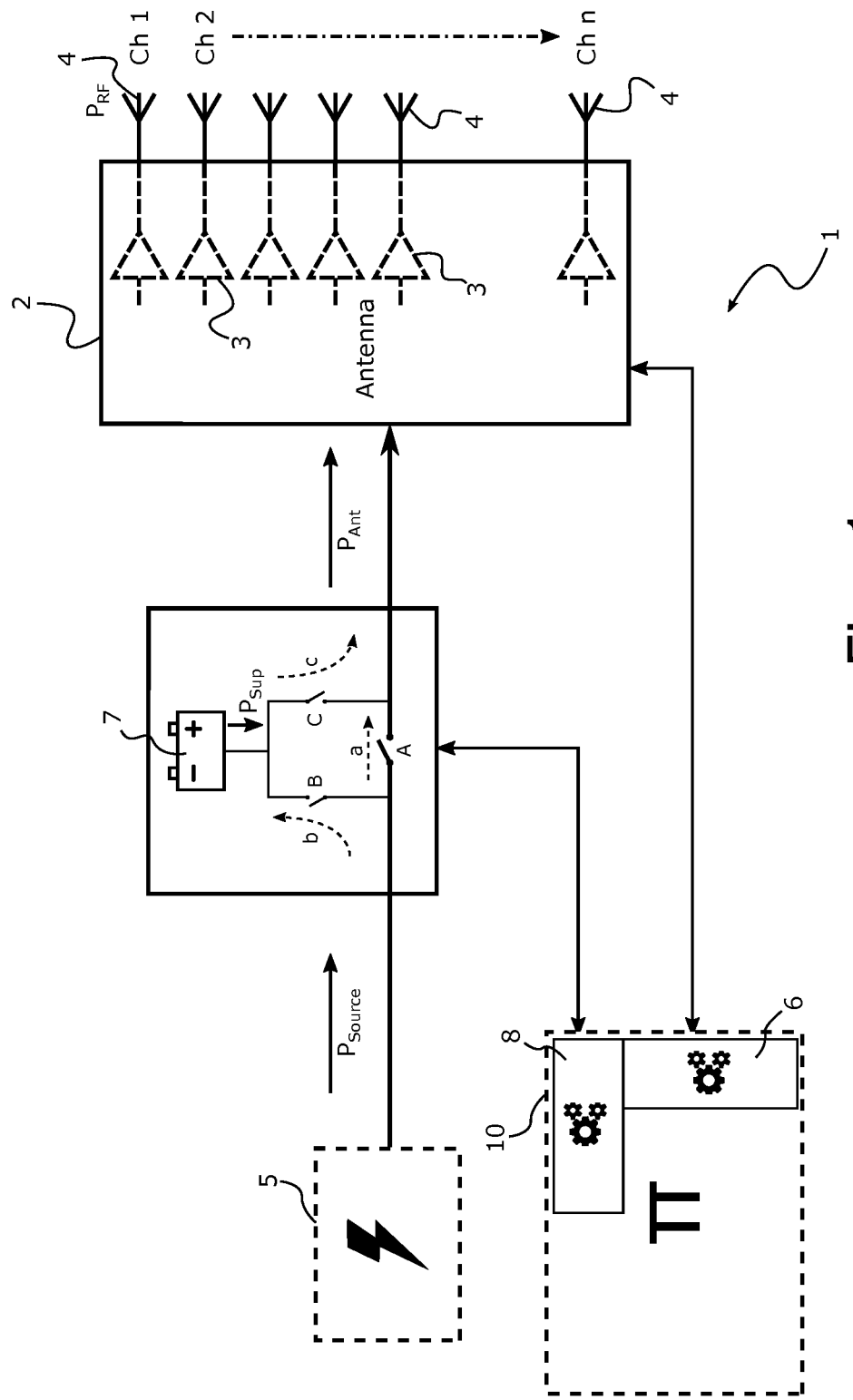
FIG. 1 is schematic block chart representation of a radar system in accordance with an embodiment of the present invention.

FIG. 1 illustrates a schematic block diagram representation of a radar system 1 in accordance with an embodiment of the present invention. The radar system 1 has an antenna arrangement 2 for transmitting and/or receiving electromagnetic waves (e.g. radio waves). The antenna arrangement 2 has a plurality of high power amplifiers (HPA) 3 and a plurality of antenna elements 4, together forming a plurality of antenna units. The antenna arrangement 2 may for example be an active electronically scanned array (AESA), where each power amplifier 3 feeds one (or more) antenna element 4 to produce output power $P_{RF}$. The total output power from the antenna arrangement 2 is determined from the sum of power for all elements (channels) 1 to n.

The radar system 1 has a power supply 5 (e.g. aircraft generator), connected to the antenna arrangement 2. The power supply 5 is adapted to supply the antenna arrangement 2 with operating power $P_{SOURCE}$. Further, the radar system 1 has an antenna controller 6 connected to the antenna arrangement 2. The antenna controller 6 is configured to control an operation of the antenna arrangement 2. The basic operation of a radar system 1, and the conventional components thereof (transmitting means, receiving means, duplexers, etc.) are considered to be readily known by the skilled artisan, and is for example disclosed in PCT application WO2016204665, and will for the sake of brevity not be further elaborated upon in the following.

Further, the radar system 1 has an auxiliary power source 7, here in the form of a battery, connectable to the antenna arrangement 2. The auxiliary power source 7 is configured to supply the antenna arrangement 2 with supplementary operating power so to (temporarily) increase a maximum output power of the antenna arrangement 2 (by increasing the available input power $P_{ANT}$). The radar system 1 also has a boost controller 8 connected to the auxiliary power source 7, and being configured to connect and disconnect the auxiliary power source to and from the antenna arrangement 2 (e.g. by means of switch C).

The antenna controller 6 and the boost controller 8 may be separate controllers, or they may be integrated into one system controller 10. Each controller 6, 8 may for example be manifested as a general-purpose processor, an application specific processor, a circuit containing processing components, a group of distributed processing components, a group of distributed computers configured for processing, a field programmable gate array (FPGA), etc. Each controller 6, 8 may further include a microprocessor, microcontroller, programmable digital signal processor or another programmable device. Each controller 6, 8 may also, or instead, include an application-specific integrated circuit, a programmable gate array or programmable array logic, a programmable logic device, or a digital signal processor. Where the controller 6, 8 includes a programmable device such as the microprocessor, microcontroller or programmable digital signal processor mentioned above, the processor may further include computer executable code that controls operation of the programmable device.

The processor (of the controllers 6, 8) may be or include any number of hardware components for conducting data or signal processing or for executing computer code stored in memory. The controllers 6, 8 may have an associated memory (not shown), and the memory may be one or more devices for storing data and/or computer code for completing or facilitating the various methods described in the present description. The memory may include volatile memory or non-volatile memory. The memory may include database components, object code components, script components, or any other type of information structure for supporting the various activities of the present description. According to an exemplary embodiment, any distributed or local memory device may be utilized with the systems and methods of this description. According to an exemplary embodiment the memory is communicably connected to the processor (e.g., via a circuit or any other wired, wireless, or network connection) and includes computer code for executing one or more processes described herein.

In order to provide the temporary boost function, when the supplementary operating power is readily available for the antenna arrangement 2, the antenna controller 6 may be configured to increase the duty cycle of the power amplifiers 3 (for pulsed radar systems). In more detail, the antenna controller 6 may be configured to control the transmit duration and pulse repetition frequency (PRF), and/or control a modulation of input RF-power to the power amplifiers 3.

Alternatively, or additionally, the antenna arrangement 2 may comprise individually controllable antenna units, such that they can be activated and deactivated independently of each other. This can for example be done by turning on and off the associated power amplifiers 3, or alternatively removing the RF input signal to the power amplifiers 3. Thus, the antenna controller 2 may be configured to activate a first set of antenna units (or channels) when the auxiliary power source 7 is not connected to the antenna arrangement 2, and to activate a second set of antenna units when the auxiliary power source 7 is connected to the antenna arrangement 2, where the second set comprises a higher/larger number of antenna units than the first set. In other words, the antenna controller 2 may be configured to operate the antenna arrangement 2 with more antenna units than "normal operation", if there is a need for it and if there is supplementary operating power $P_{SUP}$ available.

Further, as another alternative or addition, the antenna controller 6 may be configured to manage/control a peak power output of the one or more power amplifiers 3 (e.g. by controlling the biasing of the power amplifier(s), or controlling the RF drive power), when the auxiliary power source 7 is connected to the antenna arrangement 2.

The combined functionality of the two controllers 6, 8 allows for monitoring and controlling of both the output power from the antenna arrangement 2 and the power supply outputs $P_{SOURCE}$ and $P_{SUP}$, thereby facilitating adaptive antenna output power depending on available power (from the main supply 5), potential power from stored energy (from the auxiliary supply 7) and mission demand. Thus, antenna controller 6 may be configured to identify an operating mode of the antenna arrangement 2, and based on the identified operating mode, the boost controller 8 can connect or disconnect the auxiliary power source 7 to/from the antenna arrangement 2 (e.g. by means of switch C).

Furthermore, the power supply 5 is selectively and directly connectable to the antenna arrangement 2 (e.g. by means of switch A) and to the auxiliary power source 7 (e.g. by means of switch B). The boost controller 8 is accordingly further configured to connect and disconnect the power supply 5 to/from the antenna arrangement 2, and to connect/disconnect the power supply 5 to/from the auxiliary power source 7. In the latter case, the power supply 5 can be used to recharge the auxiliary power source 7 (assuming that it a rechargeable power source).

In more detail, the power supply 5 can be considered to have a limited power capacity ($P_{SOURCE}$), and with the illustrated embodiment, the switches A, B and C enable for a direction of power in accordance with the following.

If all switches A, B and C are open, the antenna arrangement 2 is turned off, and the auxiliary power source 7 is not charging.

If only switch A is closed, the power source 5 supplies the antenna arrangement with power via power flow path a, while the auxiliary power source is disconnected and not charging. Thus, $P_{ANT}$ is approximately equal to $P_{SOURCE}$ (accounting for some transmission losses).

If only switch B is closed, then the power supply 5 charges the auxiliary power source 7 via power flow path b. The charged energy is limited to $P_{SOURCE}*t$, where t is the charging time.

If only switch C is closed, then the auxiliary power source supplies $P_{SUP}$ to the antenna arrangement 2 via power flow path c.

If switches A and B are closed and switch C is open, then the power supply 5 supplies the antenna arrangement with power simultaneously as the auxiliary power storage 7 is being charged (as long as the required input power of the antenna arrangement $P_{ANT}$ is less than $P_{SOURCE}$). Thus, the auxiliary power source 7 is charged with energy limited to $(P_{SOURCE}-P_{ANT})*t$.

If switches A and C are closed and switch B is open, then both the power supply 5 and the auxiliary power source 7 supplies the antenna arrangement input power $P_{ANT}$ via power flow paths a and c. This may be construed as an "radar boost mode", where the range of the radar is increased due to higher output power capacity.

If switches B and C are closed and switch A is open, then the power output of the power supply 5, $P_{SOURCE}$, is provided to the antenna arrangement 2 via the auxiliary power source 7, thereby enabling charging whenever the antenna arrangement's input power requirement $P_{ANT}$ is less than $P_{SOURCE}$ and a "radar boost mode" upon requirement.

Moreover, the boost controller 8 is configured to check whether if the antenna arrangement 2 is in a low power mode (e.g. turned off, or during a return flight from a mission), and connect the power supply 5 to the auxiliary power source 7, if it is determined that the antenna arrangement is in the low power mode. Thereby, the radar system 1 can recharge the auxiliary power source 7 when there is no need for increased radar capacity. In other words, the arrangement allows for improved energy and power management of the radar system 1.

Figure 2:
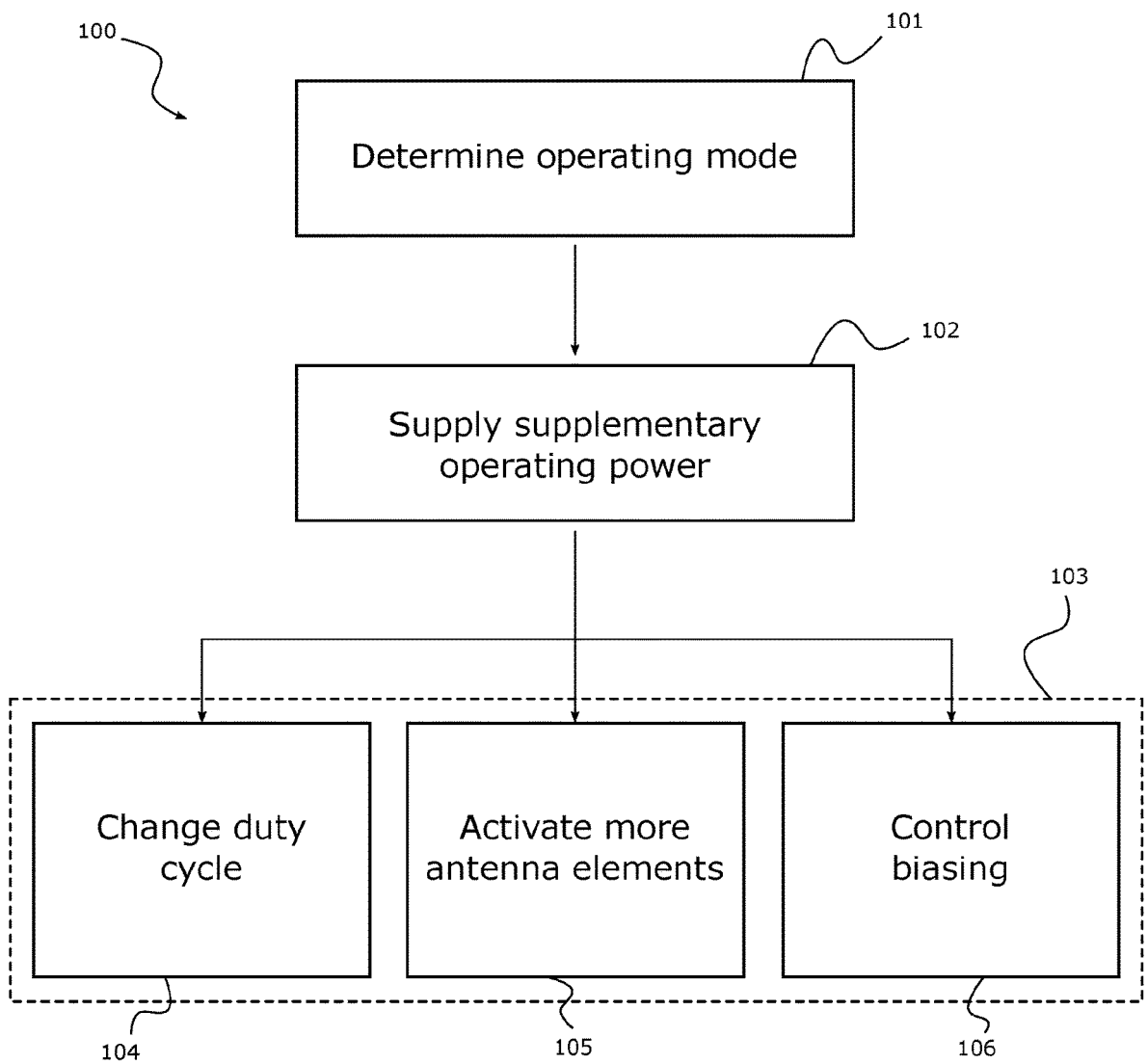
FIG. 2 is a flowchart representation of a method for controlling a radar system in accordance with an embodiment of the present invention.

FIG. 2 is a flow chart representation of a method 100 for controlling a radar system of a vehicle in accordance with an embodiment of the present invention, such as e.g. the radar system illustrated in FIG. 1. The method 100 comprises a step of determining 101 an operational mode of the antenna arrangement of the radar system. Once, the operational mode is determined (e.g. high power mode, low power mode, normal operating mode, etc.), power is supplied to the antenna arrangement from the power supply and/or the auxiliary power source, based on the determined operating mode. For example, if the operating mode is a high power mode (i.e. boost mode), it is desirable that the radar system operates at maximum range, wherefore both the (main) power supply and the auxiliary power source are arranged to supply the antenna arrangement. Analogously, if the operating mode would be a low power mode, then power would only be supplied from the (main) power supply, and any remaining power capacity would be used to re-charge the auxiliary power supply (if applicable).

Further, the output power of the antenna arrangement can be increased 103 in various alternative or complementary ways, as discussed in the foregoing. Thus, the method 100 may further comprises a step of changing 104 the duty cycle of the one or more power amplifiers in the antenna arrangement, in pulsed radar applications. Preferably, the duty cycle of the power amplifiers is increased when a "boost" in radar range is wanted or desired.

The antenna arrangement may have a plurality of antenna units, each antenna units having at least one antenna element and at least one power amplifier, and each antenna unit is an individually controllable antenna unit. Moreover, the antenna arrangement may have a first number of antenna units active during normal operation (a first set of antenna units), and once a boost in range is wanted or desired, then a higher number of antenna units can be activated 105 (a second set of antenna units). Alternatively, or additionally, the method 100 may include a step of controlling 106 a biasing of the power amplifiers of the antenna units so to increase the peak power output of the amplifiers and thereby the range of the radar system.

The present disclosure contemplates methods, devices and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor.

By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data that cause a general-purpose computer, special purpose computer, or special purpose processing machines to perform a certain function or group of functions.

Although the figures may show a specific order of method steps, the order of the steps may differ from what is depicted. In addition, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps and decision steps. Additionally, even though the disclosure has been described with reference to specific exemplifying embodiments thereof, many different alterations, modifications and the like will become apparent for those skilled in the art.

It should be understood that the controllers 6, 8 may comprise a digital signal processor arranged and configured for digital communication with an off-site server or cloud based server. Thus data may be sent to and from the controllers 6, 8.

It is to be understood that the present invention is not limited to the embodiments described above and illustrated in the drawings; rather, the skilled person will recognize that many changes and modifications may be made within the scope of the appended claims. Thus, variations to the disclosed embodiments can be understood and effected by the skilled addressee in practicing the claimed disclosure, from a study of the drawings, the disclosure, and the appended claims. Furthermore, in the claims, the word "comprising" does not exclude other elements or steps, and the indefinite article "a" or "an" does not exclude a plurality.

The invention claimed is:

1. A radar system for a vehicle comprising:
    an antenna arrangement for transmitting and/or receiving electromagnetic waves, said antenna arrangement comprising at least one antenna unit having at least one power amplifier and at least one antenna element;
    a power supply connected to said antenna arrangement, said power supply being arranged to supply said antenna arrangement with operating power;
    an antenna controller connected to said antenna arrangement, said antenna controller being configured to control an operation of said antenna arrangement;
    an auxiliary power source connectable to said antenna arrangement for supplying said antenna arrangement with supplementary operating power so to increase an output power of said antenna arrangement; and
    a boost controller connected to said auxiliary power source and to said antenna controller, said boost controller being configured to connect and disconnect said auxiliary power source to/from said antenna arrangement.

2. The radar system according to claim 1, wherein said antenna controller is configured to change a duty cycle of said at least one power amplifier when said auxiliary power source is connected to said antenna arrangement, so to increase the output power of said antenna arrangement.

3. The radar system according to claim 1, comprising a plurality of antenna units, each antenna unit being an individually controllable antenna unit, and wherein said antenna controller is configured to:
    activate a first set of antenna units when said auxiliary power source is not connected to said antenna arrangement, and
    activate a second set of antenna units when said auxiliary power source is connected to said antenna arrangement;
    wherein said second set of antenna units comprises a higher number of individually controllable antenna units than said first set of antenna units.

4. The radar system according to claim 1, wherein said antenna controller is configured to:
    increase a peak power output of said at least one power amplifier by controlling a biasing of said at least one power amplifier, when said auxiliary power source is connected to said antenna arrangement.

5. The radar system according to claim 1, wherein said antenna controller is configured to identify an operating mode of said antenna arrangement, and wherein said boost controller is configured to connect and disconnect said auxiliary power source to/from said antenna arrangement based on said operating mode.

6. The radar system according to claim 1, wherein said power supply is selectively and directly connectable to said antenna arrangement and to said auxiliary power source, and wherein said boost controller is further configured to:
    connect and disconnect said power supply from said antenna arrangement; and
    connect and disconnect said power supply from said auxiliary power source.

7. The radar system according to claim 6, wherein said antenna controller is configured to identify an operating mode of said antenna arrangement, and wherein said boost controller is configured to connect and disconnect said power supply to/from said antenna arrangement and to/from said auxiliary power source based on said operating mode.

8. The radar system according to claim 6, wherein said boost controller is further configured to:
    determine a magnitude of power and/or energy available in said auxiliary power source;
    determine a magnitude of power and/or energy available in said power supply;
    connect said power supply and/or said auxiliary power source to said antenna arrangement based on the determined magnitudes of power and/or energy available in the auxiliary power source and in the power supply.

9. The radar system according to claim 1, wherein said auxiliary power source is rechargeable and connectable to said power supply, and wherein said boost controller is configured to connect said power supply to said auxiliary power source in order to recharge said auxiliary power source.

10. The radar system according to claim 9, wherein said antenna arrangement has a low power mode, and wherein said boost controller is further configured to:
    determine if said antenna arrangement is in the low power mode;
    if said antenna arrangement is in said low power mode, connect said power supply to said auxiliary power source in order to recharge said auxiliary power source.

11. A vehicle comprising the radar system according to claim 1.

12. A method for controlling a radar system of a vehicle, said radar system comprising an antenna arrangement for transmitting and/or receiving electromagnetic waves, a power supply arranged to supply the antenna arrangement with operating power, an auxiliary power source connectable to the antenna arrangement for supplying the antenna arrangement with supplementary operating power, wherein said antenna arrangement comprises at least one antenna unit having at least one power amplifier and at least one antenna element, wherein said method comprises:

determining an operational mode of said antenna arrangement; and connecting and disconnecting the auxiliary power source to/from said antenna arrangement based on the determined operational mode.

13. The method according to claim 12, further comprising changing a duty cycle of the at least one power amplifier based on the determined operational mode.

14. The method according to claim 12, wherein the antenna arrangement comprises a plurality of antenna units, each antenna unit being an individually controllable antenna unit, and wherein the method further comprises:

activating a first set of antenna units;

activating a second set of antenna units while the supplementary operating power is being supplied to the antenna arrangement; and wherein said second set of antenna units comprises a higher number of individually controllable antenna units than said first set of antenna units.

15. The method according to claim 12, further comprising:

increasing a peak power output of said at least one power amplifier by controlling a biasing of said at least one power amplifier.

16. A computer program product comprising a non-transitory computer readable medium having stored thereon a computer program for controlling a control unit of a radar system for a vehicle, wherein the computer program product comprises code for performing the method according to claim 12.

* * * * *